United States Patent
Lypen et al.

(10) Patent No.: US 7,977,799 B2
(45) Date of Patent: Jul. 12, 2011

(54) PLANAR PACKAGELESS SEMICONDUCTOR STRUCTURE WITH VIA AND COPLANAR CONTACTS

(75) Inventors: William J. Lypen, Windsor, CO (US); Rick D. Snyder, Windsor, CO (US)

(73) Assignee: Avago Technologies Wireless IP (Singapore) Pte. Ltd., Singapore (SG)

( * ) Notice: Subject to any disclaimer, the term of this patent is extended or adjusted under 35 U.S.C. 154(b) by 530 days.

(21) Appl. No.: 12/112,652

(22) Filed: Apr. 30, 2008

(65) Prior Publication Data

US 2009/0273093 A1  Nov. 5, 2009

(51) Int. Cl.
*H01L 23/48* (2006.01)

(52) U.S. Cl. ........ 257/774; 257/621; 257/197; 257/184; 257/E23.012; 257/E23.011; 438/172; 438/675; 438/667; 438/118

(58) Field of Classification Search .......... 438/172, 438/675, 667, 118; 257/621, 197, 184, E23.012, 257/E23.011
See application file for complete search history.

(56) References Cited

U.S. PATENT DOCUMENTS

| | | | | |
|---|---|---|---|---|
| 5,684,308 | A * | 11/1997 | Lovejoy et al. | 257/184 |
| 2006/0128092 | A1 * | 6/2006 | Rouse | 438/239 |
| 2008/0164573 | A1 * | 7/2008 | Basker et al. | 257/621 |
| 2009/0302429 | A1 * | 12/2009 | Plossl et al. | 257/621 |

* cited by examiner

*Primary Examiner* — Matthew Smith
*Assistant Examiner* — Wilner Jean Baptiste

(57) ABSTRACT

A semiconductor device includes a substrate having a first side and a second side and an epitaxial layer disposed over the second side. The device also includes a conductive via extending through the epitaxial layer to the second side and comprising a conductive contact; and a bond pad disposed over the epitaxial layer and comprising a conductive material, wherein the semiconductor is not provided in a package.

20 Claims, 6 Drawing Sheets

US 7,977,799 B2

PLANAR PACKAGELESS SEMICONDUCTOR STRUCTURE WITH VIA AND COPLANAR CONTACTS

BACKGROUND

The requirements of reduced size and cost in many electronic devices and systems continue to pressure designers to provide smaller and less expensive semiconductor components, while at the very least not compromising function and performance. For example, single or discrete semiconductor components can be used in many applications including cell phones, TV set top boxes, and many other RF and non-RF products. One such component is a diode. Many known diodes are packaged into small plastic carriers and then mounted onto circuit boards for use in products. The package provides for example, a more easily handled structure during the assembly of the electronic device into which the package is provided. A drawback in using plastic packages is the added space required of the packaged device in increasingly smaller sized products such as cell phones or PDA's. Moreover, in addition to requiring more space, the packaging can cost many times more than the price of the semiconductor device provided therein.

There is a need, therefore, for a semiconductor component that overcomes at least the shortcoming of known semiconductor components discussed above.

SUMMARY

In a representative embodiment a semiconductor device includes a substrate having a first side and a second side; and an epitaxial layer disposed over the second side. The semiconductor device also includes a conductive via extending through the epitaxial layer to the second side and comprising a conductive contact; and a bond pad disposed over the epitaxial layer and comprising a conductive material. The semiconductor is not provided in a package.

In another representative embodiment, an electronic device comprises: a first substrate comprising an electrical circuit; and a semiconductor device. The semiconductor device comprises: a second substrate having a first side and a second side; a epitaxial layer disposed over the second side; a conductive via extending through the epitaxial layer to the second side and comprising a conductive contact; and a bond pad disposed over the epitaxial layer and comprising a conductive material. The semiconductor is not provided in a package.

In another representative embodiment, a semiconductor device, comprises: a substrate having a first side and a second side; a epitaxial layer disposed over the second side; a conductive via extending through the epitaxial layer to the second side and comprising a conductive contact; and a bond pad disposed over the epitaxial layer and comprising a conductive material. The semiconductor is not provided in a package and both the epitaxial layer and the substrate are doped.

In another representative embodiment, an electronic device, comprises: a first substrate comprising an electrical circuit; and a semiconductor device, comprises: a second substrate having a first side and a second side; an epitaxial layer disposed over the second side, wherein both the epitaxial layer and the second substrate are doped; a conductive via extending through the epitaxial layer to the second side and comprising a conductive contact; and a bond pad disposed over the epitaxial layer and comprising a conductive material. The semiconductor is not provided in a package.

BRIEF DESCRIPTION OF THE DRAWINGS

The present teachings are best understood from the following detailed description when read with the accompanying drawing figures. The features are not necessarily drawn to scale. Wherever practical, like reference numerals refer to like features.

DEFINED TERMINOLOGY

As used herein, the terms 'a' or 'an', as used herein are defined as one or more than one.

DETAILED DESCRIPTION

In the following detailed description, for purposes of explanation and not limitation, representative embodiments disclosing specific details are set forth in order to provide a thorough understanding of the present teachings. Descriptions of known devices, materials and manufacturing methods may be omitted so as to avoid obscuring the description of the example embodiments. Nonetheless, such devices, materials and methods that are within the purview of one of ordinary skill in the art may be used in accordance with the representative embodiments.

Representative embodiments are described in the context of Si-based p-type-intrinsic-n-type (PIN) diodes, their fabrication and electronic devices incorporating the PIN diodes. The Si PIN diodes are substantially coplanar (i.e., to within manufacturing tolerances) and are packageless. Thus, their cost is comparatively low; and their size is on the order of approximately 200 µm×400 µm×200 µm (W×L×H). As should be appreciated by one of ordinary skill in the art, the cost and size of the semiconductor devices of the representative embodiments are significantly reduced compared to their packaged counterpart.

Alternative devices may be implemented based on the present teachings. For instance, rather than a PIN diode, a Schottky diode may be fabricated and mounted in an electronic device in accordance with the present teachings. Alternatively, a pn junction diode may be fabricated. Still alternatively, transistors of various types may be fabricated by modifications that should be apparent to one of ordinary skill in the art having had the benefit of the present disclosure. Ultimately, these different types of devices will benefit from a reduction in size and cost at least because the devices are not packaged.

Certain materials and methods of fabrication are described for purposes of illustration and are not intended to limit the scope of the claims. As should be appreciated by one of ordinary skill in the art, many known methods and materials may be used instead of or in addition to those described herein. Such materials and methods are often specific to the desired resultant semiconductor device and arc within the purview of one of ordinary skill in the art. As such, in many instances the present description does not include details and alternatives of these processes and materials as these are known; and so as to avoid obscuring the description of the representative embodiments.

Figure 1:
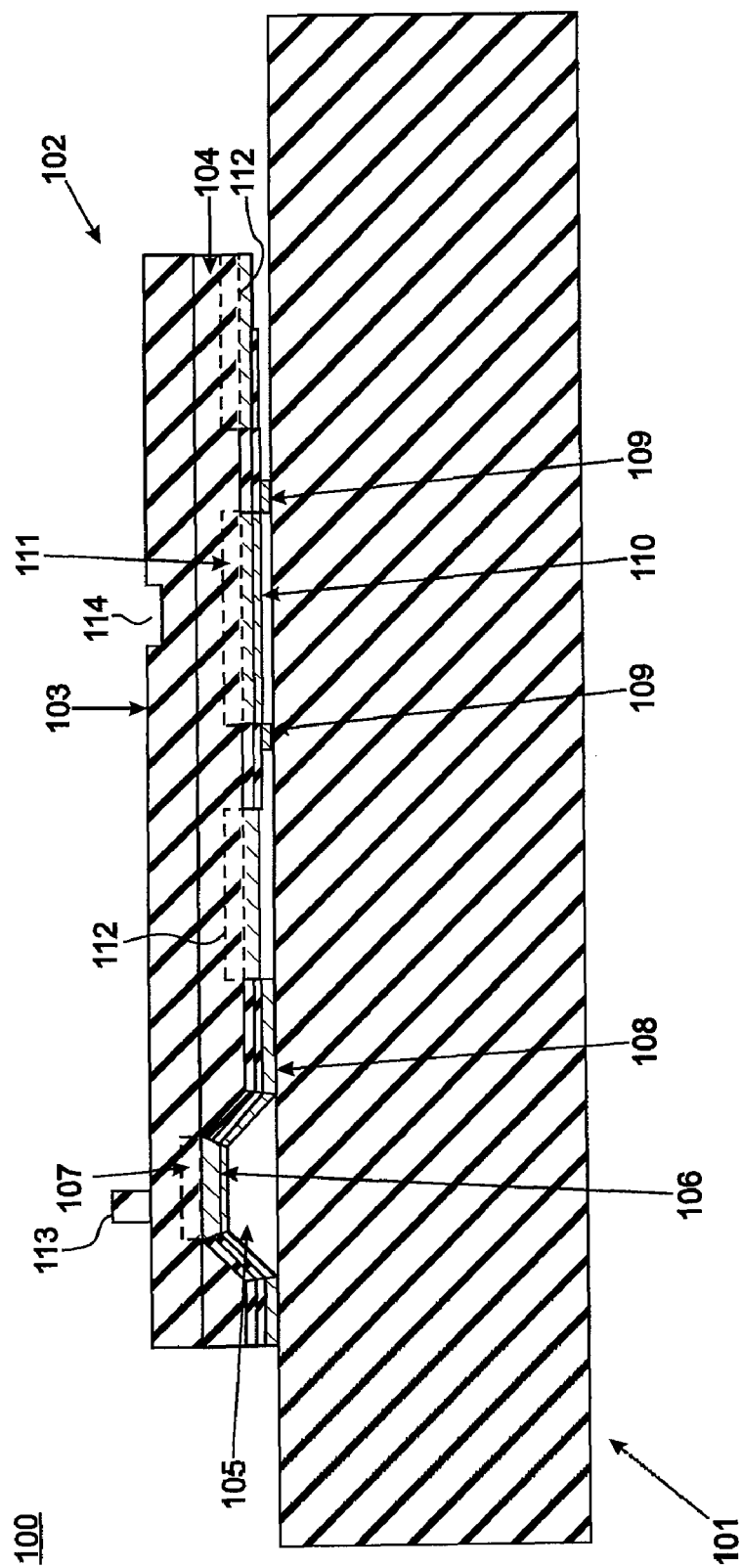
FIG. 1 is a cross-sectional view of an electronic device in accordance with a representative embodiment.

FIG. 1 is a cross-sectional view of an electronic device 100 in accordance with a representative embodiment. The electronic device comprises a first substrate 101 with a semiconductor device 102 disposed thereover. As described more fully below, the semiconductor device 102 is flip-chip bonded to the substrate. The substrate 101 may be an integrated circuit having active and passive electrical devices and circuits; or may be another suitable structure such as a circuit board. The electronic device 100 may be a component of another electronic device such as a communication device. Notably, the present teachings contemplate the electronic device and semiconductor device of the representative embodiment for use in a variety of applications. As such, the electronic device may be a component of a wireless device (e.g., cellular phones, global position system (GPS) devices or personal digital assistants (PDAs)); in television and other entertainment devices (e.g., set-top boxes and gaming devices); satellites and satellite dishes; and other communications devices (radio frequency (rf) and non-rf) where benefits of reduced cost, or reduced size, or both are useful. Finally, it is emphasized that the applications, materials, devices are merely illustrative and in no way limiting of the present teachings.

The semiconductor device 102 comprises a second substrate 103, which is illustratively one of: Si; SiGe; SiC; III-V compound semiconductor such as GaAs, InP, or $Al_xGa_{1-x}As$ with the stoiciometry determined by application; or a II-VI compound semiconductor such as ZnSe, or CdTe. In the presently described embodiment, the substrate is Si and is doped $n^+$-type with As. An epitaxial layer (epilayer) 104 is provided over the second substrate 103. In this embodiment, the epilayer 104 is intrinsic (undoped) but could be lightly or heavily doped depending on the particular application and is formed by one of a variety of known epitaxial growth methods.

The semiconductor device 102 also comprises a via 105 with a conductive layer 106 at the bottom forming the cathode of the PIN diode in the present embodiment and having a conductive layer 106 disposed thereover. The conductive layer 106 may be a metal/metal alloy or other conductive material suitable for providing electrical contact to an ohmic contact region ("contact region") 107 formed in the second substrate 103. As should be appreciated by one of ordinary skill in the art, the contact region 107 is formed by heavily doping the second substrate 103 beneath the via 105 with a suitable dopant. In this embodiment, the region is $n^+$ doped to a level needed for forming an ohmic connection. The conductive via 106 is connected to a bond pad 108, which is provided over a surface of the epilayer 104.

The semiconductor device 102 further comprises a bond pad 109 disposed annularly about another conductive layer 110, which forms the anode in the present embodiment. The conductive layer 110 is disposed over a p-doped region 111 in the epilayer 104. A field area 112 is provided annularly about the conductive layer 110 and serves to reduce leakage current in the semiconductor device 102. Finally, the semiconductor device includes a marker 113, or a second marker 114, or both, which function as fiducials so the location of the anode and cathode are more readily determined. The markers, 113, 114 may be a raised feature (e.g., a metal or dielectric bump) over the second substrate 103, or a groove or a notch etched into the second substrate 103. To this end, the markers, 113, 114 are disposed over the second substrate 103 at the first side and substantially opposite the bond pad 108 and the contact region 107.

The bond pad 109 is substantially coplanar (to within manufacturing tolerances) with the bond pad 108. The bond pads 108, 109 thereby allow the semiconductor device 102 to be mounted over the first substrate 101 in a flip-chip fashion using standard bonding methods such as a reflow technique.

Figure 2:
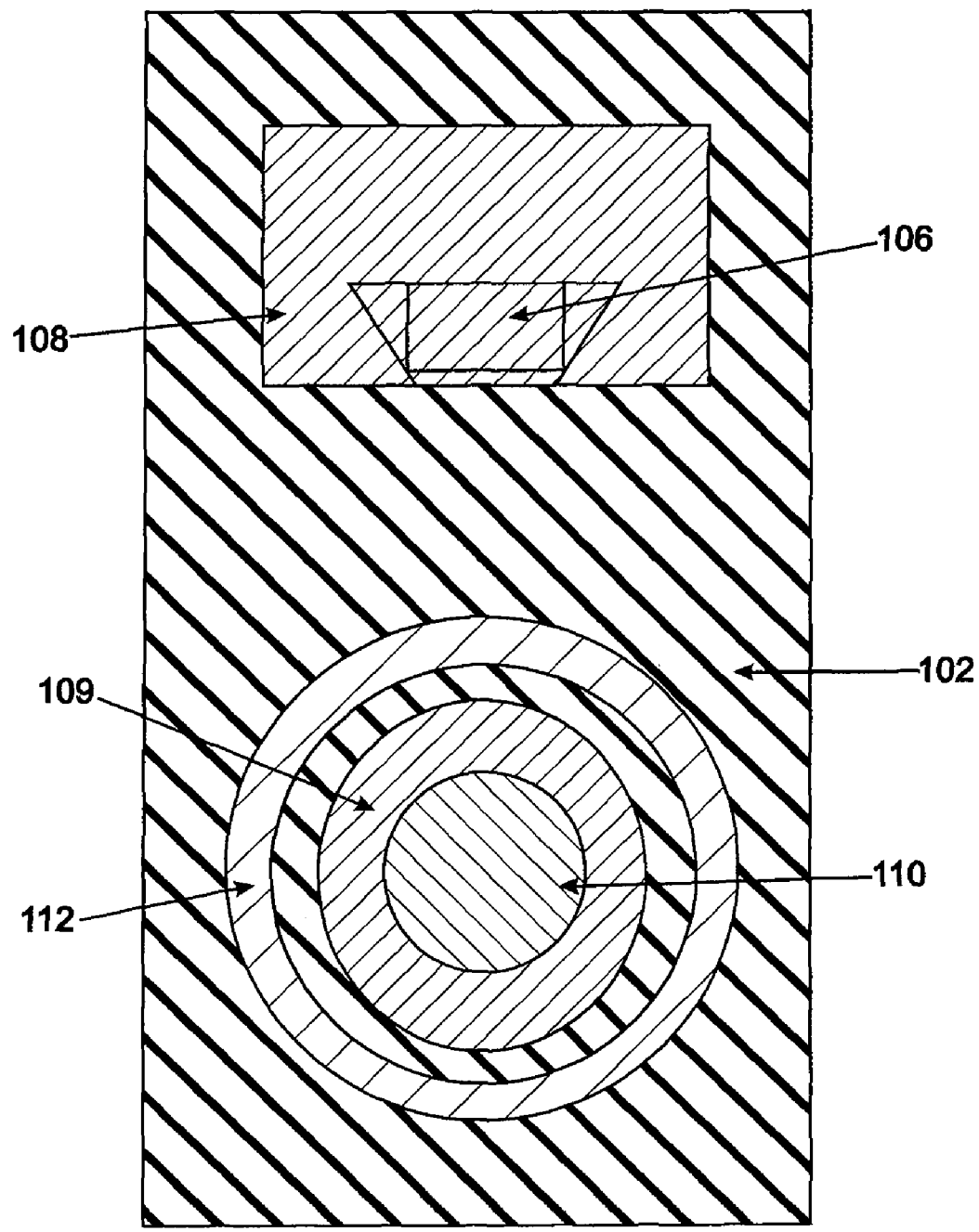
FIG. 2 is a top view of a semiconductor device in accordance with a representative embodiment.

FIG. 2 is a top view of the semiconductor device 102 in accordance with a representative embodiment. The view of FIG. 2 is of the side facing the first substrate 101; or the side of the semiconductor device 102 over which the bond pads 108, 109 are formed. As seen in FIG. 2, the bond pads 108, 109 are provided about the conductive layer 106 (e.g., cathode) and the conductive layer 110 (e.g., anode), respectively. The field area 112 is also shown more clearly in FIG. 2. Notably, the shape of the bond pads 108, 109 may be set to provide clear identification of the underlying device element. In the representative embodiment, the anode is substantially circular; and the anode is substantially rectangular. The shapes of the anode are merely illustrative; and the anode and cathode pads can take any shape.

FIGS. 3A-3D are cross-sectional views of a fabrication sequence in accordance with a representative embodiment.

Figure 3A:
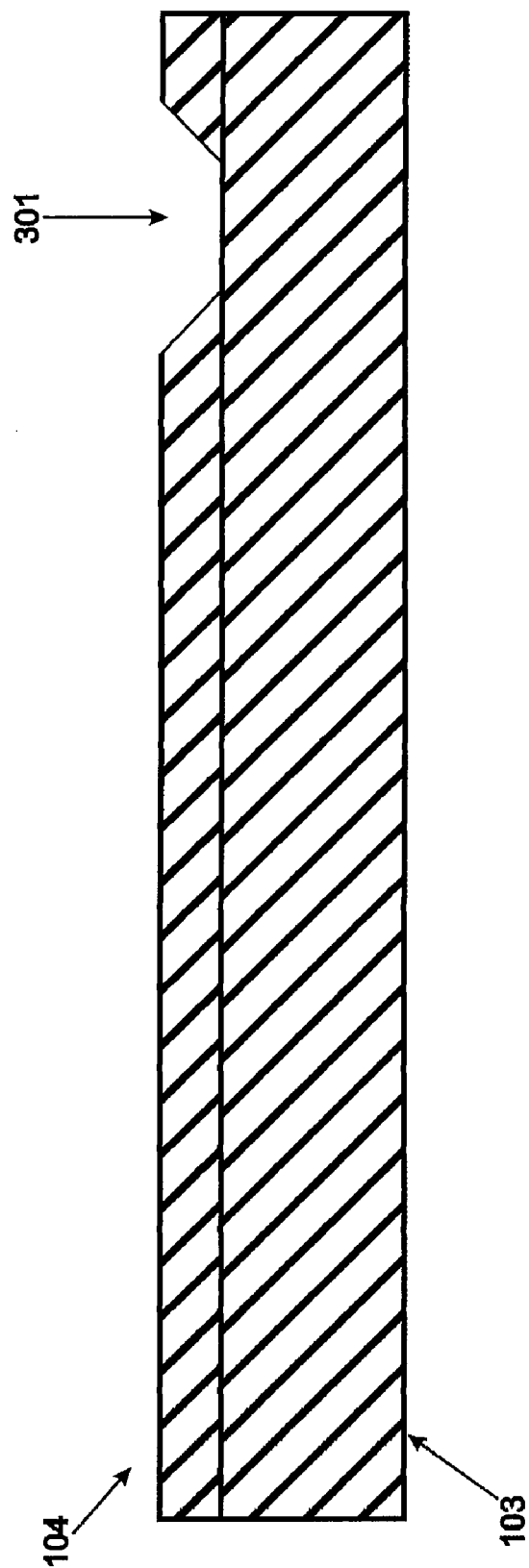
FIGS. 3A-3D are cross-sectional views of a fabrication sequence in accordance with a representative embodiment.

FIG. 3A is a cross-sectional view showing the epilayer 104 disposed over the second substrate 103. A via 301 is provided in the epilayer 104 to a depth of at least the thickness of epilayer 104. This via 301 provides through connections to the second substrate 103 and allows for the direct bonding of the semiconductor device 102 as described above. The via 301 could remain open as shown the present embodiment or could be filled at least partially with conductive metal, or a non-conductive dielectric material, or both. As noted, the second substrate 103 may be one of a variety of materials. The epilayer 104 is provided over the substrate by one of a number of epitaxial growth methods; and results in a layer having substantially the same crystalline orientation as the underlying second substrate 103. The crystalline structure of the epilayer 104 dictates the method and materials used to fabricate the via 301.

Among other considerations, the areas of the conductive layer 106 and bond pad 108 are selected to provide suitable connection area and contact resistance. As such, it may be useful to increase the area of the bottom of the conductive layer 106 without increasing the area at the top of the conductive layer 106. As will be appreciated, in some instances, it may be useful to provide a via that is has a greater length and width, that depth, which is limited generally to the depth of the epilayer 104. As such, anisotropic etching may be implemented to increase the area of the via 301. Etching of the via 301 may begin with a dry-etch, which provides a high aspect-ratio (i.e., vertical) etch, followed by a wet etch along a particular set of crystalline planes to increase the area of the via or to enable easier metal coverage.

In a representative embodiment, the dry etch may be one of a variety of plasma etching methods. For instance, the so-called Bosch method may be used. The wet etch may be effected using an appropriate etchant for the material of the epilayer 104; and for the type of crystalline material of the epilayer. Alternatively, the comparatively low aspect ratio via 301 may be formed by wet-etching. A wide variety of shapes can be attained for the via 301, dictated by the selected material for the epilayer and the etching method. For instance <100> Si can be wet-etched with buffered KOH to form an inverted trapezoid.

After fabrication of the via 301, the process continues with the formation of the contact region 107 and the field area 112.

Figure 3B:
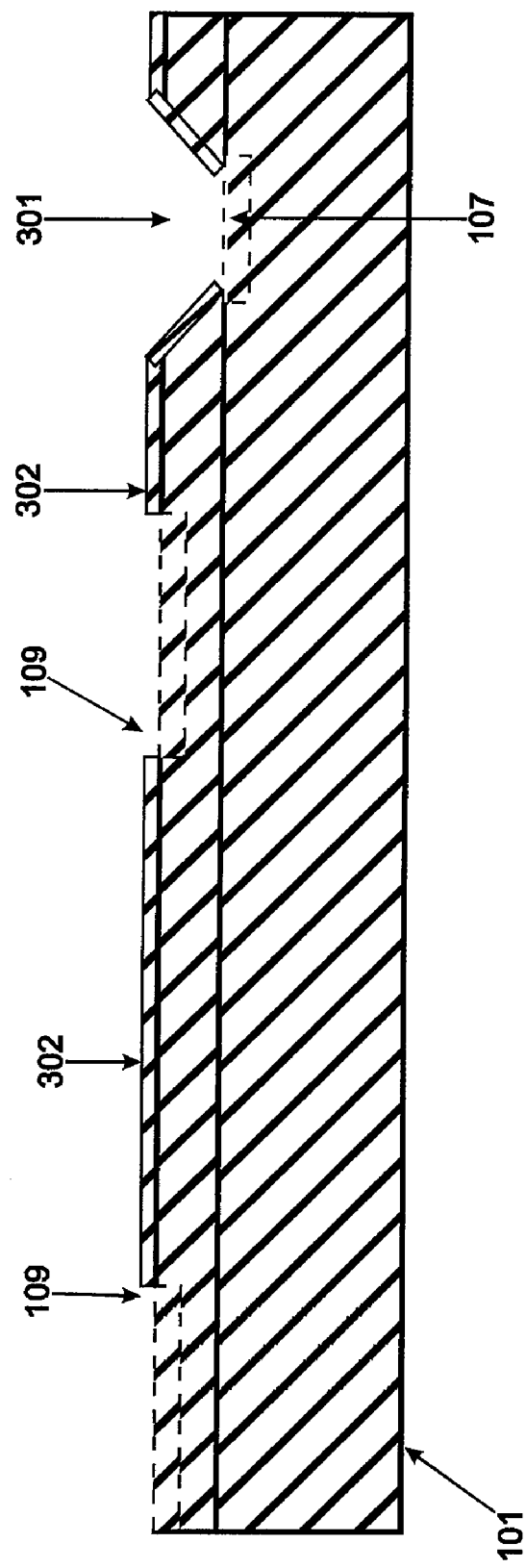

This process is shown in FIG. 3B. The process includes patterning an oxide layer 302 to mask and passivate the areas that are not exposed to dopant implantation or diffusion. Next, n-type dopants are provided to form the contact region 107 and field area 112. In an illustrative embodiment, the phosphorous (P) dopants are diffused by known technique to provide heavily doped (n$^+$) to reduce device resistance and surface charge leakage.

Figure 3C:
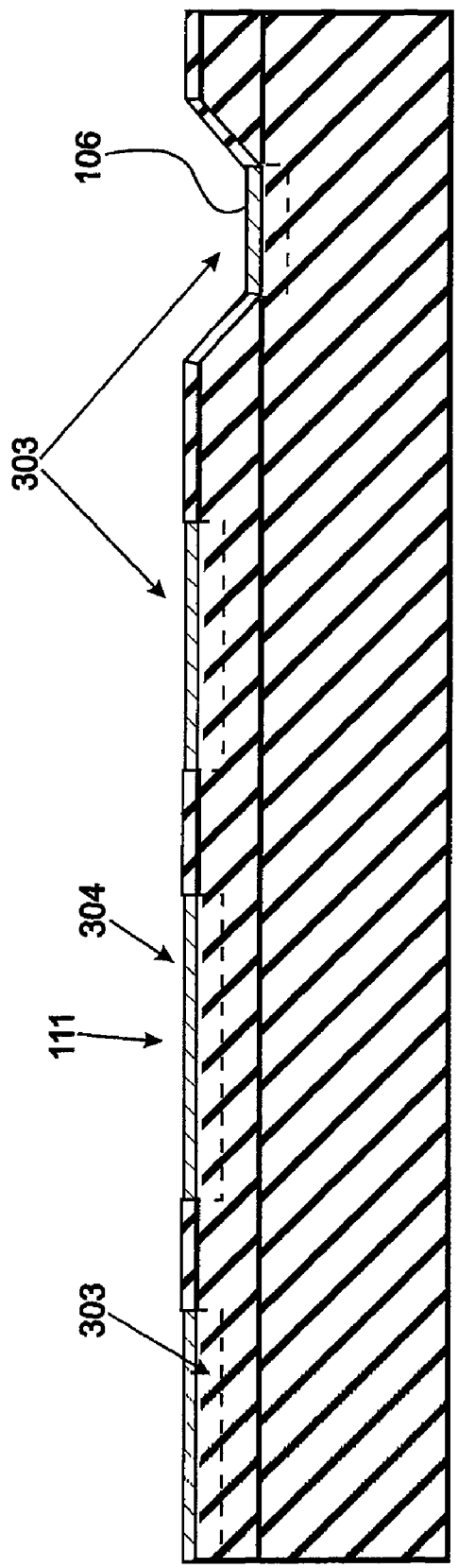

FIG. 3C shows the next step in the process. After diffusion of the dopants in the forming of the field area 112, the p-doped region 111 of the anode is formed. First, an oxide layer 303 is deposited over the field area 112 and the contact region 107. Next the p-doped region 111 is formed by diffusion of boron, in the present illustrative embodiment. The p-dopants are diffused by a known method. Next a nitride deposition step is effected for passivation.

Figure 3D:
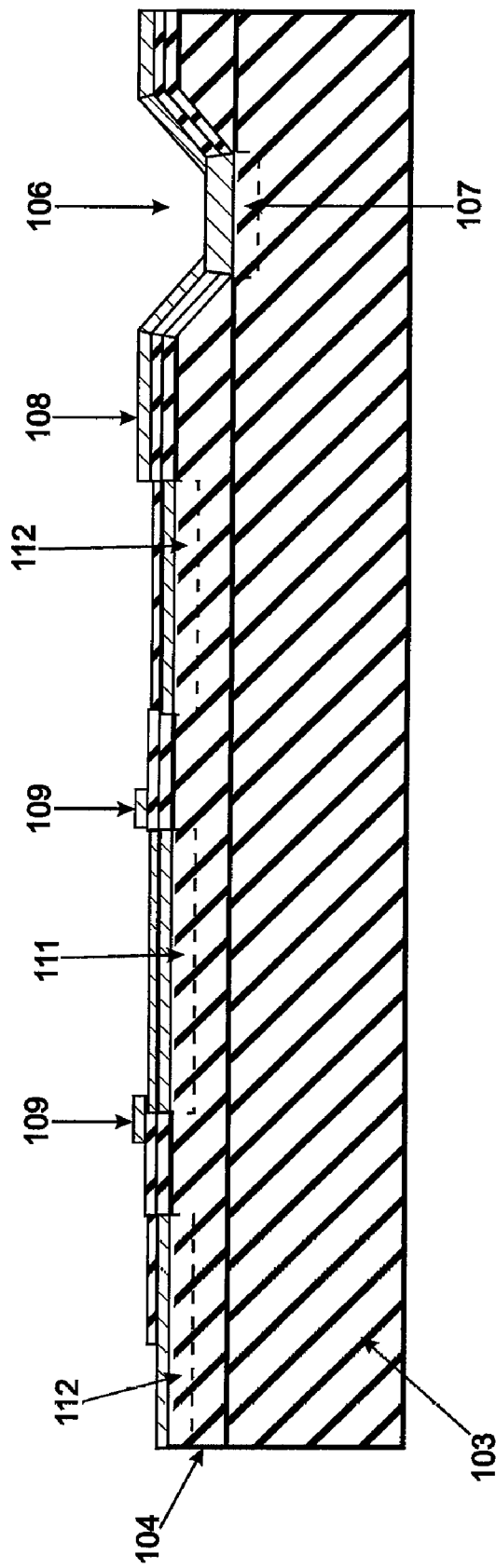

FIG. 3D shows the next steps in the process, which includes applying the metal for the contact region 107, the conductive layer 110 and bond pads 108, 109. The metal contact layers can be substantially identical; or can be made of different materials. Illustratively, multi-layer contacts are provided and comprise platinum silicide/tungsten nitride/gold. The formation of the contacts is by one of a variety of known methods.

After metallization is completed, a back grinding sequence is carried out to reduce the thickness of the second substrate 103. This method reduces the thickness of the second substrate 103 to on the order of approximately 200 µm. Next, markers 113,114 (also referred to as alignment fiducials) is formed over the first surface of the substrate 103 and opposite the conductive via 107 and bond pad 110. These fiducials may be deposited metal or dielectric properly located. Alternatively, the markers 113, 114 may be etched into the first surface of the substrate; or may be a combination of deposited (raised) and etched (recessed) features.

As alluded to previously, the present teachings are applicable to other known semiconductor structures. While many devices are contemplated, a brief variation of the process sequence can provide a Schottky diode. Notably, rather than forming a p-doped region 111, a metal contact is formed from a metal of a specified work function directly on the epilayer. To this end, placing the Schottky metal at the location of the conductive layer (e.g., anode) 110 provides the metal semiconductor interface with the epilayer. In the present example, the epilayer may be doped or undoped. Current flow is again through the second substrate 103, which is doped and to the conductive layer 106. As will be appreciated, the dopant types and levels may differ from those described in connection with the PIN structure, but the basic fabrication sequence remains the same. The resultant packageless Schottky diode provides similar performance to a packaged device; and at a reduced cost and size.

In view of this disclosure it is noted that the various planar packageless semiconductor structure and methods of fabrication described herein can be implemented in a variety of materials and variant structures. Moreover, applications other than resonator filters may benefit from the present teachings. Further, the various materials, structures and parameters are included by way of example only and not in any limiting sense. In view of this disclosure, those skilled in the art can implement the present teachings in determining their own applications and needed materials and equipment to implement these applications, while remaining within the scope of the appended claims.

The invention claimed is:

1. A semiconductor device, comprising:
a substrate having a first side and a second side;
a epitaxial layer disposed over the second side;
a conductive via extending through the epitaxial layer to the second side and comprising a conductive contact; and
a bond pad disposed over the epitaxial layer and comprising a conductive material, wherein the semiconductor device is not provided in a package.

2. A semiconductor device as claimed in claim 1, wherein the via and the bond pad are substantially coplanar.

3. A semiconductor device as claimed in claim 1, wherein the substrate comprises one of: Si, SiGe, SiC or a III-V semiconductor material.

4. A semiconductor device as claimed in claim 1, wherein the epitaxial layer comprises one of Si, SiGe, SiC or a III-V semiconductor material.

5. A semiconductor device as claimed in claim 1, wherein the epitaxial layer is undoped, and the substrate is doped.

6. A semiconductor device as claimed in claim 5, wherein a region beneath the bond pad is p-doped and the semiconductor device comprises a PIN diode.

7. A semiconductor device as claimed in claim 6, wherein the substrate is n-doped.

8. An electronic device as claimed in claim 5, wherein a region beneath the bond pad is p-doped and the semiconductor device comprises a PIN diode.

9. An electronic device as claimed in claim 8, wherein the second substrate is n-doped.

10. A semiconductor device as claimed in claim 1, further comprising an alignment fiducial disposed over the second side of the substrate.

11. A semiconductor device as claimed in claim 1, comprising an alignment fiducial disposed over the second side of the substrate and substantially opposite the bond pad and another alignment fiducial disposed over the second side of the substrate and substantially opposite the conductive via.

12. An electronic device, comprising:
a first substrate comprising an electrical circuit; and
a semiconductor device, comprising:
a second substrate having a first side and a second side;
a epitaxial layer disposed over the second side;
a conductive via extending through the epitaxial layer to the second side and comprising a conductive contact; and
a bond pad disposed over the epitaxial layer and comprising a conductive material, wherein the semiconductor device is not provided in a package.

13. An electronic device as claimed in claim 12, wherein the via and the bond pad are substantially coplanar.

14. An electronic device as claimed in claim 13, comprising an alignment fiducial disposed over the second side of the second substrate and substantially opposite the bond pad and another alignment fiducial disposed over the second side of the second substrate and substantially opposite the conductive via.

15. An electronic device as claimed in claim 12, wherein the second substrate comprises one of: Si, SiGe, SiC or a III-V semiconductor material.

16. An electronic device as claimed in claim 12, wherein the epitaxial layer comprises one of Si, SiGe, SiC or a III-V semiconductor material.

17. An electronic device, as claimed in claim 12, wherein the epitaxial layer is undoped, and the second substrate is doped.

18. An electronic device as claimed in claim 12, further comprising an alignment fiducial disposed over the second side of the second substrate.

19. A semiconductor device, comprising:
   a substrate having a first side and a second side;
   a epitaxial layer disposed over the second side;
   a conductive via extending through the epitaxial layer to the second side and comprising a conductive contact; and
   a bond pad disposed over the epitaxial layer and comprising a conductive material, wherein the semiconductor device is not provided in a package, wherein both the epitaxial layer and the substrate are doped.

20. An electronic device, comprising:
   a first substrate comprising an electrical circuit; and
   a semiconductor device, comprising:
   a second substrate having a first side and a second side;
   a epitaxial layer disposed over the second side, wherein both the epitaxial layer and the second substrate are doped;
   a conductive via extending through the epitaxial layer to the second side and comprising a conductive contact; and
   a bond pad disposed over the epitaxial layer and comprising a conductive material, wherein the semiconductor device is not provided in a package.

* * * * *